(12) United States Patent
Bi et al.

(10) Patent No.: US 10,020,221 B1
(45) Date of Patent: Jul. 10, 2018

(54) METHOD AND STRUCTURE FOR MINIMIZING FIN REVEAL VARIATION IN FINFET TRANSISTOR

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Hao Tang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/787,107

(22) Filed: Oct. 18, 2017

Related U.S. Application Data

(63) Continuation of application No. 15/498,661, filed on Apr. 27, 2017.

(51) Int. Cl.
| | |
|---|---|
| *H01L 27/148* | (2006.01) |
| *H01L 29/80* | (2006.01) |
| *H01L 29/76* | (2006.01) |
| *H01L 21/00* | (2006.01) |
| *H01L 21/338* | (2006.01) |
| *H01L 21/762* | (2006.01) |
| *H01L 29/06* | (2006.01) |
| *H01L 29/78* | (2006.01) |
| *H01L 21/311* | (2006.01) |
| *H01L 21/3115* | (2006.01) |
| *H01L 29/66* | (2006.01) |

(52) U.S. Cl.
CPC .. *H01L 21/76224* (2013.01); *H01L 21/31116* (2013.01); *H01L 21/31155* (2013.01); *H01L 29/0649* (2013.01); *H01L 29/66795* (2013.01); *H01L 29/7851* (2013.01)

(58) Field of Classification Search
CPC ..... H01L 21/823431; H01L 21/823487; H01L 21/823821; H01L 21/823885; H01L 27/0886; H01L 27/0924; H01L 27/10841; H01L 29/785; H01L 29/78642; H01L 29/7926; H01L 29/66795; H01L 29/66545
USPC ........ 257/220, 263, 328, 330, 331; 438/156, 438/173, 192, 212, 268
See application file for complete search history.

(56) References Cited

U.S. PATENT DOCUMENTS

| | | |
|---|---|---|
| 7,871,873 B2 | 1/2011 | Maszara et al. |
| 8,058,161 B2 | 11/2011 | Barna et al. |
| 8,440,517 B2 | 5/2013 | Lin et al. |
| 8,785,284 B1 | 7/2014 | Bergendahl et al. |

(Continued)

OTHER PUBLICATIONS

J. Sun et al., "Studies on Radiation Stability of Polymers," International Atomic Energy Agency (IAEA-TECDOC, Jan. 1999, pp. 11-19, vol. 30, No. 10.

(Continued)

*Primary Examiner* — Hsien Ming Lee
(74) *Attorney, Agent, or Firm* — Vazken Alexanian; Ryan, Mason & Lewis, LLP

(57) ABSTRACT

A semiconductor device includes a plurality of fins spaced apart from each other on a substrate; a liner layer on the substrate between each fin of the plurality of fins and on at least a portion of a sidewall of each fin; and a plurality of isolation regions adjacent and between the plurality of fins. The plurality of isolation regions includes a dielectric layer; and a doped region on the dielectric layer.

16 Claims, 7 Drawing Sheets

(56) References Cited

U.S. PATENT DOCUMENTS

| | | | |
|---|---|---|---|
| 9,281,378 | B2 | 3/2016 | Ching et al. |
| 9,691,766 | B1 * | 6/2017 | Lin .................... H01L 27/0886 |
| 2008/0081404 | A1 | 4/2008 | Barna et al. |
| 2014/0131776 | A1 | 5/2014 | Ching et al. |
| 2014/0159126 | A1 | 6/2014 | Wei et al. |
| 2014/0252497 | A1 | 9/2014 | Peng et al. |
| 2014/0306317 | A1 | 10/2014 | Licausi |
| 2015/0021690 | A1 | 1/2015 | Jacob et al. |
| 2015/0069473 | A1 | 3/2015 | Glass et al. |
| 2016/0365344 | A1 | 12/2016 | Feng et al. |
| 2017/0117188 | A1 * | 4/2017 | Zhou ............... H01L 21/823807 |

OTHER PUBLICATIONS

John W. Born, "Nuclear Radiation Resistant Polymers and Polymeric Compounds," B.F. Goodrich Company Research Center, Wright Air Development Division, WADC Technical Report 55-58, Part 6, Oct. 1, 1960, 111 pages.

L. Li et al., "Nanofabrication on Unconventional Substrates Using Transferred Hard Masks," Scientific Reports 5, Jan. 15, 2015, pp. 1-6, Article No. 7802.

L. Du et al., "Optimization of STI Oxide Recess Uniformity for FinFET Beyond 20nm," Semiconductor Technology International Conference (CSTIC), Mar. 15-16, 2015, 4 pages.

\* cited by examiner

METHOD AND STRUCTURE FOR MINIMIZING FIN REVEAL VARIATION IN FINFET TRANSISTOR

TECHNICAL FIELD

The field generally relates to semiconductor devices and methods of manufacturing same and, in particular, to using a doped etch resistance layer to prevent variation in the height of recessed isolation regions.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors.

Known methods for manufacturing FinFET devices include patterning the fins and recessing, by, for example, etching, a dielectric layer between the fins to form recessed isolation regions. Variations in pitch between the fins (also referred to herein as "pitch walk" or "incoming pitch walk") and the patterning density, caused during the fin patterning process, cause the dielectric layer between the fins to be recessed to different levels. As result, since fin height is defined by heights of the recessed isolation regions, variations in the heights of the recessed isolations result in varied fin heights (e.g., device width) due to the incoming pitch walk and patterning density variation. The recessed isolation region height variation may occur on different sides of the same fin.

SUMMARY

According to an exemplary embodiment of the present invention, a semiconductor device includes a plurality of fins spaced apart from each other on a substrate; a liner layer on the substrate between each fin of the plurality of fins and on at least a portion of a sidewall of each fin; and a plurality of isolation regions adjacent and between the plurality of fins. The plurality of isolation regions includes a dielectric layer; and a doped region on the dielectric layer.

According to an exemplary embodiment of the present invention, a semiconductor device includes a plurality of fins spaced apart from each other on a substrate, wherein each fin of the plurality of fins is derived from Si, SiGe or a III-V material; and a plurality of isolation regions adjacent and between the plurality of fins. The plurality of isolation regions include a dielectric layer; and a doped region on the dielectric layer.

According to an exemplary embodiment of the present invention, a method for manufacturing a semiconductor device includes forming a stacked structure on a substrate, the stacked structure including a semiconductor layer, a dielectric layer on the semiconductor layer, and a polymer layer on the dielectric layer. The method further includes patterning the stacked structure into a plurality of stacked portions each comprising a fin under a patterned portion of the dielectric layer and a patterned portion of the polymer layer, forming an inter-level dielectric layer on the substrate between the plurality of stacked portions, forming a doped region in the inter-level dielectric layer at a depth below a top surface of the inter-level dielectric layer, and recessing the inter-level dielectric layer down to the doped region to form a plurality of isolation regions between the plurality of stacked portions.

According to an exemplary embodiment of the present invention, a method for manufacturing a semiconductor device includes forming a plurality of stacked portions spaced apart from each other on a substrate, each of the plurality of stacked portions including a semiconductor fin, a dielectric layer on the semiconductor fin, and a polymer layer on the dielectric layer. The method also includes forming an inter-level dielectric layer on the substrate between the plurality of stacked portions, forming a doped region in the inter-level dielectric layer at a depth below a top surface of the inter-level dielectric layer, and recessing the inter-level dielectric layer down to the doped region to form a plurality of isolation regions between the plurality of stacked portions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 2:
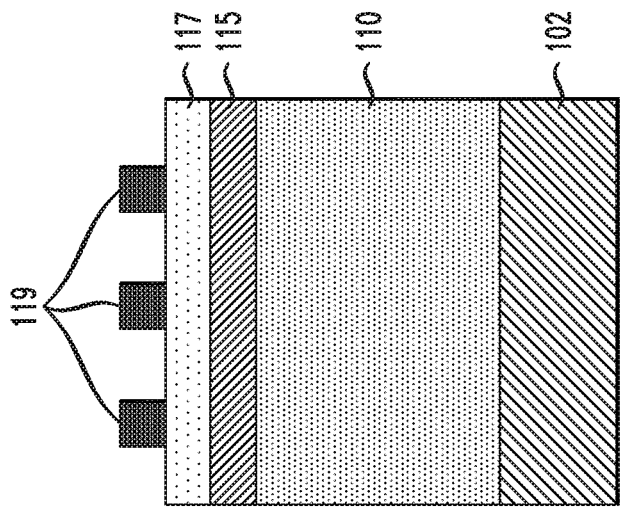
FIG. 2 is a cross-sectional view of formation of an organic planarization layer (OPL) mask and patterning of the OPL layer in a method of manufacturing a semiconductor device, according to an exemplary embodiment of the present invention.

Exemplary embodiments of the invention will now be discussed in further detail with regard to semiconductor devices and methods of manufacturing same and, in particular, to forming a doped region function as an etch resistance layer and prevent height variations in isolation regions due to pitch walk.

It is to be understood that the various layers and/or regions shown in the accompanying drawings are not drawn to scale, and that one or more layers and/or regions of a type commonly used in, for example, a complementary metal-oxide semiconductor (CMOS), nanowire field-effect transistor (FET), fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, nanowire FETs, nanosheet FETs, vertical FETs, SETs, CMOSs and/or MOSFETs. By way of non-limiting example, the semiconductor devices can include, but are not necessarily limited to FinFET, nanowire FET, nanosheet FET, vertical FET, SET, CMOS and MOSFET devices, and/or semiconductor devices that use FinFET, nanowire FET, nanosheet FET, vertical FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Illustrative embodiments of the present invention provide a method and structure for minimizing fin reveal variation in FinFET transistors. Although discussed in terms of fins and FinFET transistors, embodiments of the present invention are not necessarily limited thereto, and may be applicable to other types of devices or structures, such as, but not necessarily limited to, nanowire FETs and nanosheet FETs.

In accordance with an embodiment of the present invention, a doped region, including, but not necessarily limited to, a hafnium silicon oxide (HfSiO$_x$) wet etch resistance layer, is formed in an isolation layer (e.g., shallow trench isolation (STI) layer) by ion implantation. The doped region is not affected by incoming pitch walk and is able to work as an etch stop when recessing the isolation layer. As a result, variation in the height of recessed isolation regions is prevented so that, in turn, resulting fin height is consistent with respect to each isolation region.

In addition, embodiments of the present invention utilize for example, a poly(methyl methacrylate) (PMMA) or a cross-linked polytetrafluoroethylene (PTFE) layer as a hard mask for radiation resistance to protect fins during ion implantation.

Figure 1:
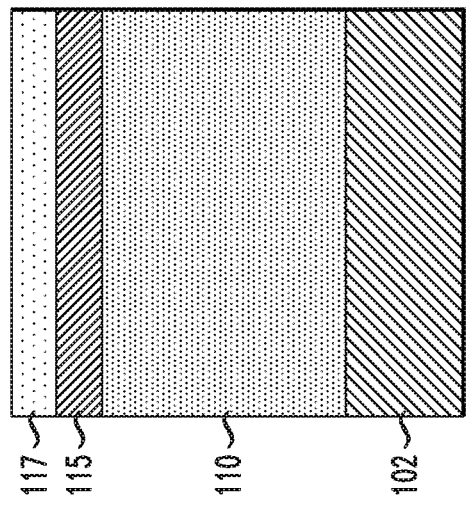
FIG. 1 is a cross-sectional view of formation of semiconductor and hard mask layers in a method of manufacturing a semiconductor device, according to an exemplary embodiment of the present invention.

FIG. 1 is a cross-sectional view of formation of semiconductor and hard mask layers in a method of manufacturing a semiconductor device, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 102 can be a bulk substrate or a silicon-on-insulator (SOI) substrate including a buried insulating layer, such as, for example, a buried oxide or nitride layer.

A semiconductor layer 110, which is eventually patterned into the fins 112, is formed on the substrate 102. The semiconductor layer can include, but is not necessarily limited to, Si, SiGe or III-V materials, and may be epitaxially grown. According to an embodiment, a first hard mask 115 including, for example, a dielectric material, such as silicon nitride (SiN) is formed on the semiconductor layer 110 using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. The hard mask layer 115 thickness can be in the range of about 10 nm to about 100 nm.

A second hard mask layer 117 including, for example, a radiation resistant polymer, such as PMMA or a cross-linked PTFE, is formed on the first hard mask layer 115, using, for example, a deposition technique noted above. The thickness of radiation resistant hard mask layer 117 can be in the range of about 50 nm to about 100 nm. Certain common polyolefins, such as, but not necessarily limited to, PTFE, which undergo primarily chain scission when irradiated at room temperature, can be cross-linked by irradiation at high temperature. The cross-linking improves their subsequent radiation resistance.

Radiation stability of polymers can be increased by forming a network structure. The mechanical properties of polymers depend on their molecular weight. For radiation cross-linkable polymers, the molecular weight increases with increased radiation dose, and thus, their mechanical properties are improved markedly.

Figure 3:
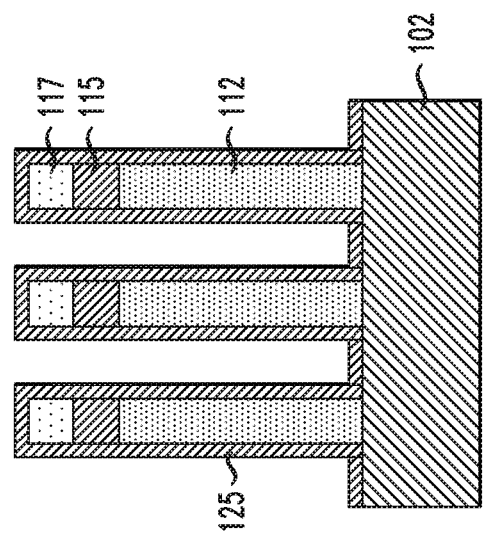
FIG. 3 is a cross-sectional view of fin patterning in a method of manufacturing a semiconductor device, according to an exemplary embodiment of the present invention.

FIG. 2 is a cross-sectional view of formation of an organic planarization layer (OPL) mask and patterning of the OPL layer, and FIG. 3 is a cross-sectional view of fin patterning in a method of manufacturing a semiconductor device, according to an exemplary embodiment of the present invention. Referring to FIGS. 2 and 3, an OPL is formed on the second hard mask 117 and patterned into mask portions 119 covering portions of the semiconductor layer 110 that are to be patterned into the fins 112, and covering portions of the first and second hard masks 115 and 117 that remain on the patterned fins 112. In accordance with an embodiment of the present invention, the OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL material can be deposited, for example, by spin coating. The OPL can be patterned into the mask portions 119 by an anisotropic removal process, such as, for example, a reactive ion etch (RIE) process, or by lithography and/or double patterning processes.

Referring to FIGS. 2 and 3, the semiconductor layer 110 is patterned into a plurality of fins 112 using, for example, an anisotropic removal process, such as, for example, RIE.

As can be seen, the portions of the semiconductor layer 110 and first and second hard mask layers 115 and 117 left exposed by the OPL mask portions 119 are removed, resulting in the stacked configuration of the OPL portions 119 and first and second hard mask layers 115 and 117 on the fins 112. Although three fins 112 are shown in the figures for ease of explanation, more (or less) than three fins can be formed.

Figure 4:
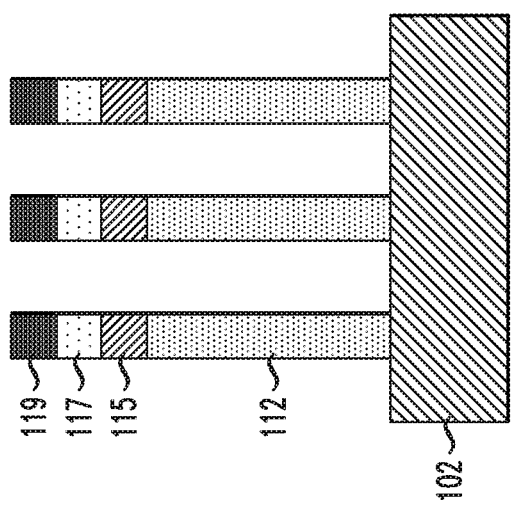
FIG. 4 is a cross-sectional view of a liner deposition in a method of manufacturing a semiconductor device, according to an exemplary embodiment of the present invention.

FIG. 4 is a cross-sectional view of a liner deposition in a method of manufacturing a semiconductor device, according to an exemplary embodiment of the present invention. Referring to FIG. 4, the OPL mask portions 119 are stripped using, for example, oxygen plasma, nitrogen plasma, hydrogen plasma or other carbon strip process. OPL stripping causes minimal or no damage to the fins 112 or the layers 115 and 117. Following stripping of the OPL portions 119, a semiconductor liner layer 125, including, for example, a dielectric material, such as SiN, is conformally deposited on the stacked configuration of the fins 112 and layers 115 and 117, and on the substrate 102. The conformal deposition can be performed using a conformal deposition process, such as, but not necessarily limited to, ALD. The thickness of the conformal liner can be in the range of about 1 nm-about 10 nm.

Figure 5:
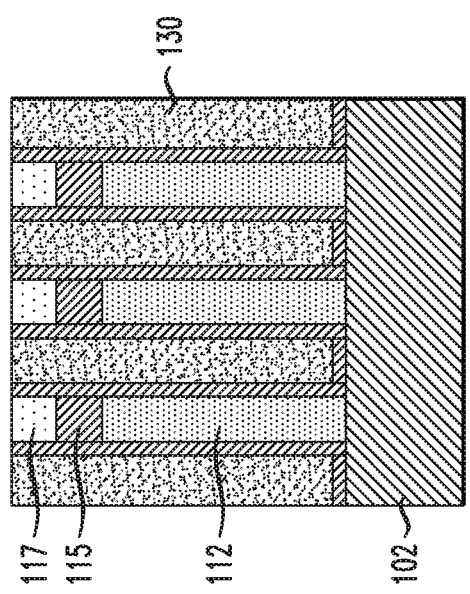
FIG. 5 is a cross-sectional view of deposition of an inter-level dielectric and planarization in a method of manufacturing a semiconductor device, according to an exemplary embodiment of the present invention.

FIG. 5 is a cross-sectional view of deposition of an inter-level dielectric and planarization in a method of manufacturing a semiconductor device, according to an exemplary embodiment of the present invention. Referring to FIG. 5, a dielectric material layer 130, including, but not necessarily limited to silicon dioxide ($SiO_2$), low-temperature oxide (LTO), high-temperature oxide (HTO), flowable oxide (FOX) or some other dielectric, is deposited on the structure from FIG. 4, including on the exposed liner layer 125 and in gaps between the fins 112. The dielectric material can be deposited using deposition techniques including, but not limited to, CVD, PECVD, RFCVD, PVD, ALD, MLD, MBD, PLD, LSMCD and/or sputtering, followed by a planarization process, such as, chemical mechanical planarization (CMP) to remove excess dielectric material 130 and the liner layer 125 from a top surface of the layer 117. As described further herein, the dielectric material layer 130 is recessed in a subsequent processing step to form isolation regions.

Figure 6:
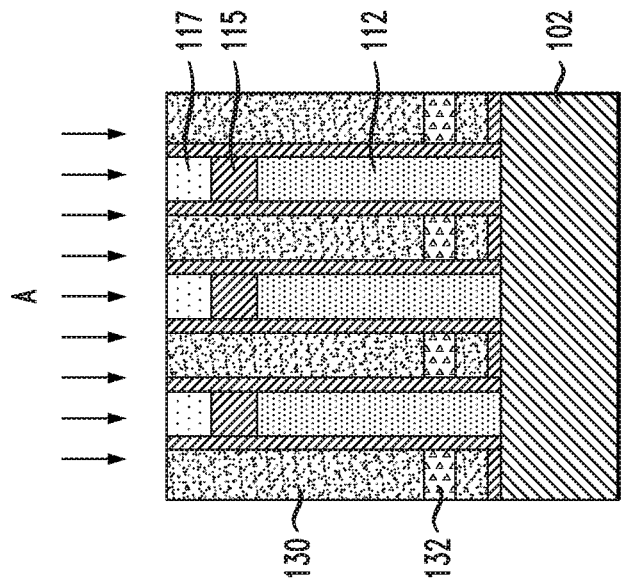
FIG. 6 is a cross-sectional view of ion implantation to form a doped region in the inter-level dielectric in a method of manufacturing a semiconductor device, according to an exemplary embodiment of the present invention.

FIG. 6 is a cross-sectional view of ion implantation to form a doped region in the inter-level dielectric in a method of manufacturing a semiconductor device, according to an exemplary embodiment of the present invention. Referring to FIG. 6, as shown by the arrows labeled A, ion implantation, using, for example, an ion implanter, is performed to form a doped region 132 in the dielectric layer 130. The parameters of the ion implantation process, including, for example, radiation acceleration voltage (implantation voltage), dose and type of dopant, affect a position (i.e., depth in the layer 130) and a vertical thickness of the doped region 132.

Figure 11:
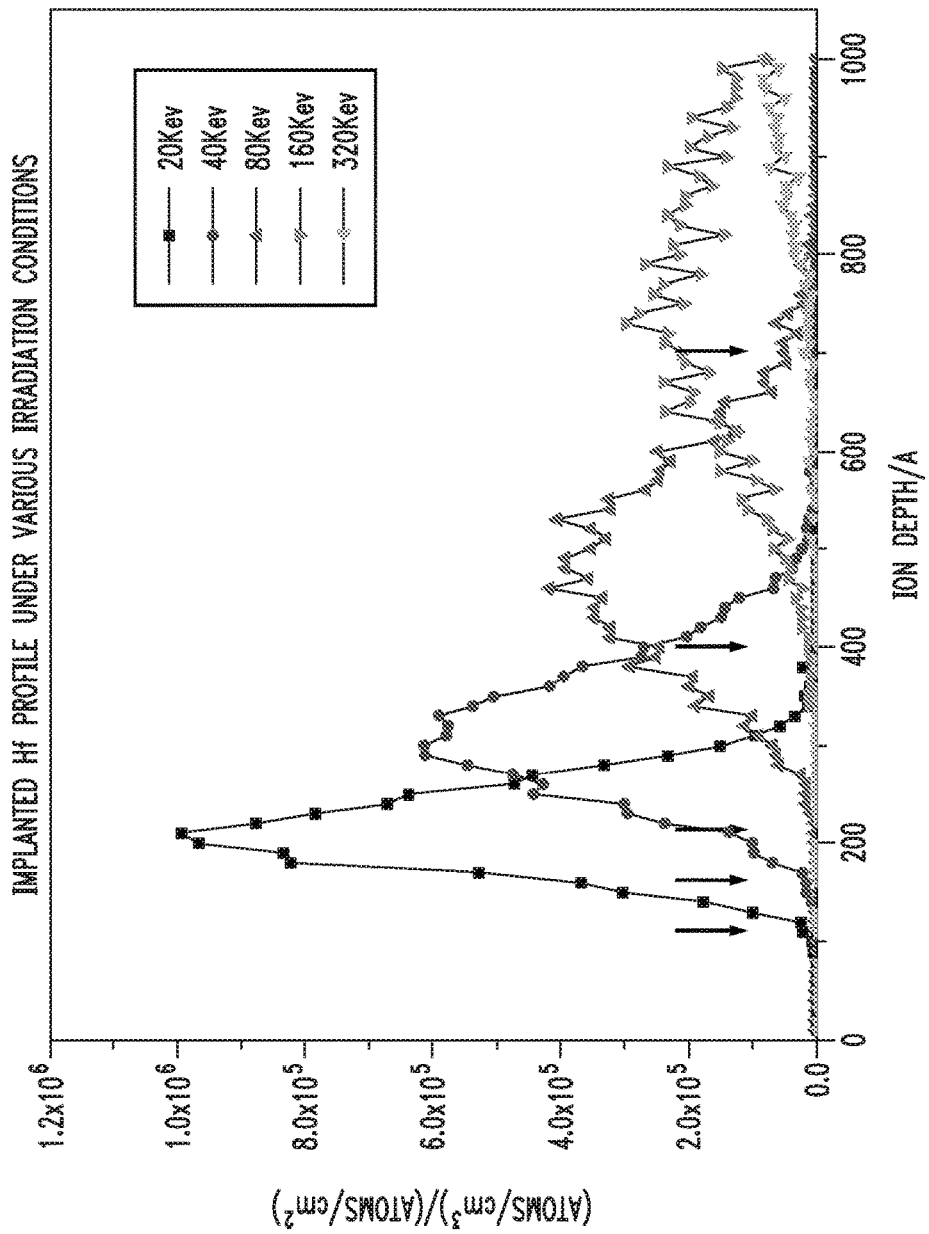
FIG. 11 is a graph of dopant concentration versus ion depth corresponding to radiation acceleration voltage (also referred to as "implantation voltage"), according to an exemplary embodiment of the present invention.

For example, referring to FIG. 11, with hafnium (Hf) as a dopant, when the acceleration voltage is 20 Kev, the doped region 132 including the dopant ions is localized at a depth of about 200 angstroms from a top surface of the layers 130 and 117, as illustrated by the peak of the curve with the square plot points. Further, the sharp profile of the curve with the square plot points indicates a doped region 132 having a smaller vertical thickness than the doped regions formed using higher acceleration voltages. When the acceleration voltage is 40 Kev, the doped region 132 is localized at a depth of about 300 angstroms from a top surface of the layers 130 and 117, as illustrated by the peak of the curve with the circular plot points. Further, the flatter profile of the curve with the circular plot points indicates a doped region 132 having a greater vertical thickness than a doped region formed with 20 Kev, but a smaller vertical thickness than the doped regions formed using higher acceleration voltages. When the acceleration voltage is 80 Kev, the doped region 132 is localized at a depth of about 450-550 angstroms from a top surface of the layers 130 and 117, as illustrated by the peak of the curve with the triangular plot points. Further, the flatter profile of the curve with the triangular plot points indicates a doped region 132 having a greater vertical thickness than doped regions formed with 20 or 40 Kev, but a smaller vertical thickness than the doped regions formed using higher acceleration voltages. When the acceleration voltage is 160 Kev, the doped region 132 is localized at a depth of about 700-900 angstroms from a top surface of the layers 130 and 117, as illustrated by the peak of the curve with the upside down triangular plot points. Further, the flatter profile of the curve with the upside down triangular plot points indicates a doped region 132 having a greater vertical thickness than doped regions formed with 20, 40 or 80 Kev, but a smaller vertical thickness than the doped regions formed using 320 Key. When the acceleration voltage is 320 Kev, the doped region 132 is localized at a depth of about 800-1000 angstroms from a top surface of the layers 130 and 117, as illustrated by the peak of the curve with the sideways triangular plot points. Further, the flatter profile of the curve with the sideways triangular plot points indicates a doped region 132 having a greater vertical thickness than the doped regions formed using the lower acceleration voltages.

Figure 12:
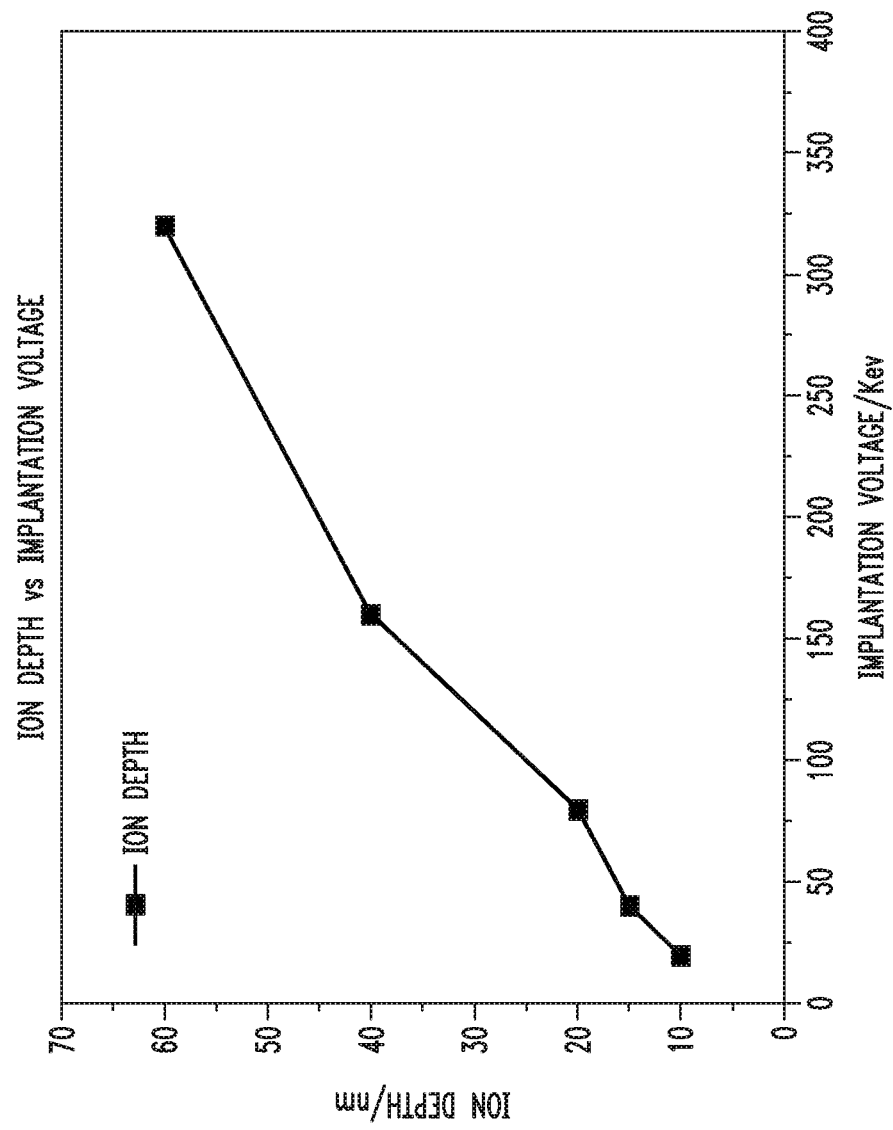
FIG. 12 is a graph of ion depth versus radiation acceleration voltage ("implantation voltage"), according to an exemplary embodiment of the present invention.

The downward facing arrows in FIG. 11 respectively indicate approximate starting depths (i.e., top surfaces) of the doped region 132 from a top surface of the layer 130 for implantations done at 20, 40, 80, 160 and 320 Key. FIG. 12, which is a graph of ion depth versus radiation acceleration voltage ("implantation voltage"), according to an exemplary embodiment of the present invention, illustrates that a depth of the doped region 132 from a top surface of the layers 130 and 117 increases with increasing implantation voltage.

The radiation resistant polymer layer 117, such as PMMA or a cross-linked PTFE, and the liner and hard mask layers 125 and 115 protect the fins 112 from radiation damage caused by the ions during the ion implantation process. When using hafnium (Hf) as a dopant and silicon dioxide ($SiO_2$) as a dielectric layer 130, the doped region 132 comprises a hafnium silicon oxide ($HfSiO_x$) wet etch resistance layer. As an alternative to Hf, other dopants, such as, for example, xenon (Xe), tantalum (Ta), tungsten (W) can be used to create the doped region 132. A dose range of the dopant can be for example, from $1e+12/cm^2$ to $1e+15/cm^2$.

Figure 7:
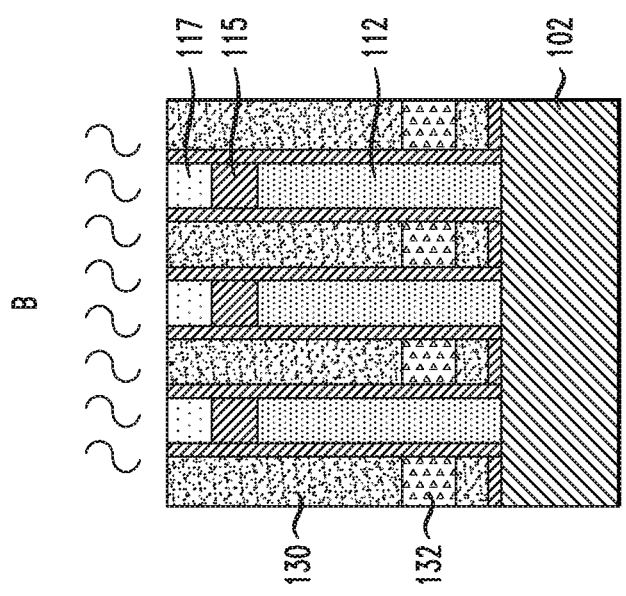
FIG. 7 is a cross-sectional view of dopant activation in a method of manufacturing a semiconductor device, according to an exemplary embodiment of the present invention.

FIG. 7 is a cross-sectional view of dopant activation in a method of manufacturing a semiconductor device, according to an exemplary embodiment of the present invention. Referring to FIG. 7, an annealing process (shown by curved lines B), such as rapid thermal processing (RTP), is performed to activate the dopant. The RTP is performed at, for example, less than about 1000° C. for about 10 seconds to about 1 minute. As can be seen by a comparison of FIGS. 6 and 7, the annealing process increases a vertical thickness of the doped region 132.

Figure 8:
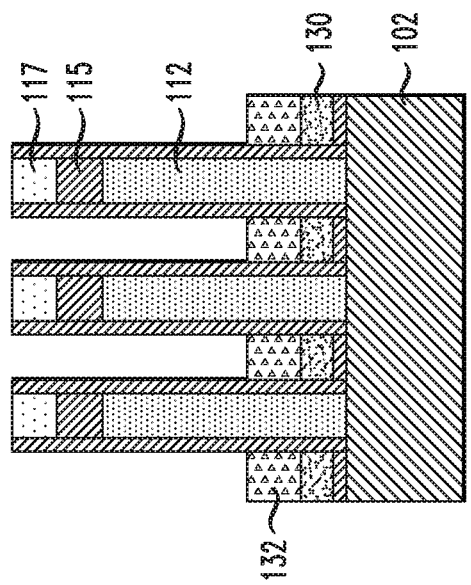
FIG. 8 is a cross-sectional view of recessing of the inter-level dielectric to form isolation regions in a method of manufacturing a semiconductor device, according to an exemplary embodiment of the present invention.

FIG. 8 is a cross-sectional view of recessing of the inter-level dielectric to form isolation regions in a method of manufacturing a semiconductor device, according to an exemplary embodiment of the present invention. Referring to FIG. 8, the layer 130 is recessed down to the doped region 132 using, for example, a wet etch of BHF chemistry or dry etch based on HF chemistry. As described herein, the doped region 132 functions as an etch stop layer so that the dielectric layer 130 is uniformly recessed down to the doped region 132 to form isolation regions (e.g., STI regions) between the fins 112 regardless of incoming pitch walk. The resulting isolation regions 130, including the doped regions 132, are at the same or substantially the same height above the substrate so that the height of the fins 112, measured with respect to the isolation regions, is likewise uniform.

Figure 9:
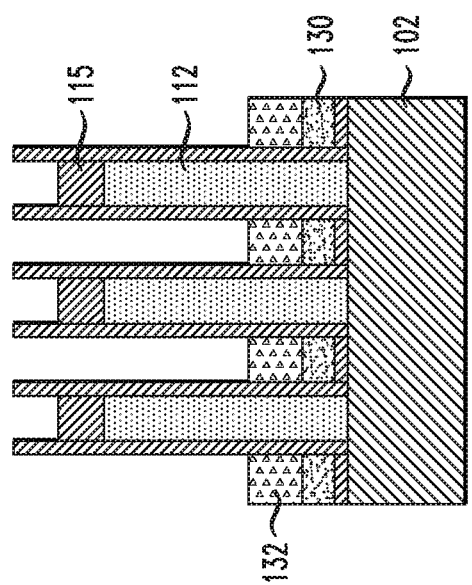
FIG. 9 is a cross-sectional view of stripping of a hard mask layer in a method of manufacturing a semiconductor device, according to an exemplary embodiment of the present invention.

FIG. 9 is a cross-sectional view of stripping of a hard mask layer in a method of manufacturing a semiconductor device, according to an exemplary embodiment of the present invention. Referring to FIG. 9, radiation resistant polymer hard mask layer 117 is selectively stripped from the resulting structure of FIG. 8 with respect to the liner and hard mask layers 125 and 115, and the doped region 132. The stripping is performed using, for example, $O_2$ plasma recess.

Figure 10:
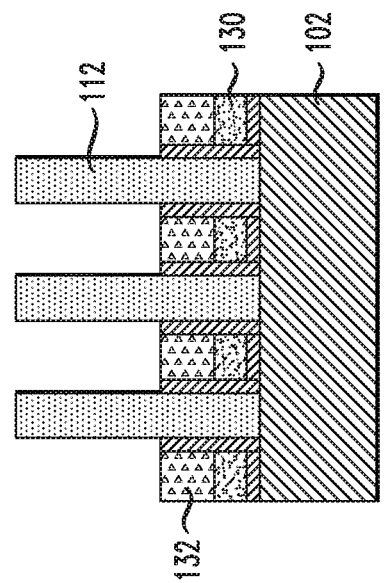
FIG. 10 is a cross-sectional view of stripping of hard mask and liner layers in a method of manufacturing a semiconductor device, according to an exemplary embodiment of the present invention.

FIG. 10 is a cross-sectional view of stripping of hard mask and liner layers in a method of manufacturing a semiconductor device, according to an exemplary embodiment of the present invention. Referring to FIG. 10, the hard mask and liner layers 115, 125, which can be formed from the same or similar material (e.g., SiN), are selectively removed with respect to the fins 112 and the doped region 132 to result in the structure in FIG. 10. The selective removal can be performed by a stripping process, using, for example, hot phosphoric acid or $NH_3+H_2$ dry etch.

The resulting fin reveal structure includes uniform isolation regions 130 including the doped regions 132. Subsequent processing includes gate formation around the fins 112, using known processing, such as, for example, replacement metal gate (RMG) processing, which can include forming a plurality of gate structures around the fins 112, and, according to an embodiment, forming spacers on sides of the gate structures. In accordance with an embodiment of the present invention, a gate dielectric layer can be formed under the gate structure. The gate dielectric layer includes, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide deposited on and around the fins 112 and isolation and doped regions 130, 132. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. According to an embodiment, the gate structure includes a work-function metal (WFM) layer, including but not limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer. The gate structure can further include a gate layer including, but not necessarily limited to, amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited on the WFM layer and the gate dielectric layer. A gate extension direction is in the left and right directions in the cross-sectional views.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a plurality of fins spaced apart from each other on a substrate;
   a liner layer on the substrate between each fin of the plurality of fins and on at least a portion of a sidewall of each fin; and
   a plurality of isolation regions adjacent and between the plurality of fins;
   wherein the plurality of isolation regions comprise:
      a dielectric layer; and
      a doped region on the dielectric layer,
   wherein the doped region of each of the plurality of isolation regions comprises hafnium silicon oxide (HfSiO) or one or more of a xenon, tantalum, and tungsten dopant.

2. The semiconductor device according to claim 1, wherein a height of each of the plurality of isolation regions is the same.

3. The semiconductor device according to claim 1, wherein the dielectric layer of each of the plurality of isolation regions comprises silicon dioxide ($SiO_2$), a low-temperature oxide (LTO), a high-temperature oxide (HTO), or a flowable oxide (FOX).

4. The semiconductor device according to claim 1, wherein the liner layer comprises a dielectric material.

5. The semiconductor device according to claim 4, wherein the dielectric material is silicon nitride.

6. The semiconductor device according to claim 1, wherein each fin of the plurality of fins comprises Si, SiGe or a III-V material.

7. The semiconductor device according to claim 1, wherein a height of each fin of the plurality of fins is the same.

8. A semiconductor device, comprising:
   a plurality of fins spaced apart from each other on a substrate;
   a liner layer on the substrate between each fin of the plurality of fins and on at least a portion of a sidewall of each fin; and
   a plurality of isolation regions adjacent and between the plurality of fins;
   wherein the plurality of isolation regions comprise:
      a dielectric layer; and
      a doped region on the dielectric layer,
   wherein a height of the liner layer is the same as the height of each of the plurality of isolation regions.

9. A semiconductor device, comprising:
   a plurality of fins spaced apart from each other on a substrate, wherein each fin of the plurality of fins is derived from Si, SiGe or a III-V material; and
   a plurality of isolation regions adjacent and between the plurality of fins;
   wherein the plurality of isolation regions comprise:
      a dielectric layer; and
      a doped region on the dielectric layer,
   wherein the doped region of each of the plurality of isolation regions comprises hafnium silicon oxide (HfSiO) or one or more of a xenon, tantalum, and tungsten dopant.

10. The semiconductor device according to claim 9, wherein a height of each of the plurality of isolation regions is the same.

11. The semiconductor device according to claim 9, wherein the dielectric layer of each of the plurality of isolation regions comprises silicon dioxide ($SiO_2$), a low-temperature oxide (LTO), a high-temperature oxide (HTO), or a flowable oxide (FOX).

12. The semiconductor device according to claim 9, further comprising a liner layer between each fin of the plurality of fins and each adjacent isolation region of the plurality of isolation regions.

13. The semiconductor device according to claim 12, wherein the liner layer comprises a dielectric material.

14. The semiconductor device according to claim 13, wherein the dielectric material is silicon nitride.

15. The semiconductor device according to claim 12, wherein a height of the liner layer is the same as the height of each of the plurality of isolation regions.

16. The semiconductor device according to claim 9, wherein a height of each fin of the plurality of fins is the same.

* * * * *